United States Patent [19]

Jones et al.

[11] Patent Number: 4,996,433

[45] Date of Patent: Feb. 26, 1991

[54] SPECIMEN HEATING HOLDER FOR ELECTRON MICROSCOPES

[75] Inventors: Joseph S. Jones, Pleasanton; Peter R. Swann, Diablo, both of Calif.

[73] Assignee: Gatan, Inc., Pleasanton, Calif.

[21] Appl. No.: 431,402

[22] Filed: Nov. 6, 1989

[51] Int. Cl.⁵ .............................. H01J 37/20
[52] U.S. Cl. ................ 250/443.1; 250/442.1
[58] Field of Search ............. 250/440.1, 442.1, 443.1

[56] References Cited

U.S. PATENT DOCUMENTS

| | | | |
|---|---|---|---|
| 3,643,091 | 2/1972 | Lucas | 250/442.1 |
| 3,909,611 | 9/1975 | von Rauch | 250/442.1 |
| 4,703,181 | 10/1987 | Swann et al. | 250/442.1 |
| 4,771,178 | 9/1988 | Egle et al. | 250/442.1 |
| 4,773,087 | 3/1988 | Narita et al. | 250/442.1 |

Primary Examiner—Bruce C. Anderson

[57] ABSTRACT

A specimen heating holder for side entry transmission electron microscopes is described. The holder permits specimen tilt about two orthogonal axes and has the capability of raising the specimen temperature to ~1000° C. A novel hinged electrical connection, resistant to fatigue, supplies, supplies power to a heater within the specimen cradle. Special low thermal conductivity cradle bearings minimize the required heater current and promote ease of assembly yet are sufficiently strong to make specimen loading easy.

4 Claims, 3 Drawing Sheets

SPECIMEN HEATING HOLDER FOR ELECTRON MICROSCOPES

BACKGROUND—FIELD OF INVENTION

The invention relates to specimen heating holders for electron microscopes and specifically to holders capable of specimen tilting about two axes.

BACKGROUND—DESCRIPTION OF PRIOR ART

Numerous fundamental phenomena are temperature dependent. Additionally, high temperature processes are important in many areas of manufacturing. For these reasons electron microscopists are interested in undertaking studies of many materials at elevated specimen temperatures.

Severe constraints are imposed on specimen holders by the limited space available inside a transmission electron microscope (TEM). Particularly when specimen heating or cooling holders are considered, the design requirements of mechanical strength and thermal insulation are contradictory. Further, temperature extremes may quickly result in the mechanical failure of delicate components. These difficulties are particularly severe for heating holders capable of tilting the specimen about two axes (so called double-tilt holders). In such holders, 4 electrical connections to the specimen cradle are desirable: 2 thermocouple leads and 2 leads to supply electricity to the heater element. Repeated cycles of heating, flexing at high temperatures as the specimen cradle is tilted, cooling and further flexing rapidly result in failure. This can be minimized and even prevented in the case of the thermocouple leads by choosing wires of sufficiently small diameter. However, wires of a diameter small enough not to suffer serious fatigue from flexing at, e.g. 1000° C., are incapable of carrying sufficient current to generate the required temperature. Indeed, the design problems are so severe that no double-tilt specimen heating holders are known to be currently commercially available.

A phenomenon of particular consequence is that heat conduction between components in contact under vacuum is strongly dependent on the force pressing the components together, almost to the exclusion of the apparent area of contact. This is understood by realizing that no surface is perfectly flat. Therefore, surfaces which are apparently in contact may actually only be touching at a few points. Under conditions of normal atmospheric pressure, this is of minor consequence since the spaces between the components are filled with air which conducts heat across the join. Under vacuum, however, there is no interstitial gas to provide a conductive pathway and heat flow is restricted to the points of actual contact. By forcing the components together, the true contact area is greatly increased and thermal conductivity improved. At very high temperatures where radiative heat transfer predominates, this effect again becomes of minor significance. However, at any practical temperature attainable within an electron microscope the force pressing two components together determines the conductivity across the interface.

The phenomenon noted above has import consequences for the design of a double-tilt heating holder. In particular, careful design and dimensioning of the specimen cradle bearings significantly reduces their thermal conductivity while still providing sufficient mechanical strength so that the user does not damage the bearings when loading and unloading specimens. This is particularly advantageous for double-tilt heating holders since maximum thermal isolation of the specimen cradle minimizes the required heater current, allowing the wires providing electrical power to the heater to be of a relatively small diameter.

OBJECTS AND ADVANTAGES

Accordingly several objects and advantages of this invention are: to provide a double-tilt heating holder for side entry transmission electron microscopes capable of heating the specimen to high temperatures while permitting specimen tilting about two orthogonal axes, having long-lived, fatigue-resistant electrical connections to the specimen cradle, obviating the need for frequent repair and low thermal conductivity specimen cradle bearings sufficiently resilient to permit easy specimen loading with minimal risk of damage to the cradle bearings.

Readers will find further objects and advantages of the invention from a consideration of the ensuing description and the accompanying drawings.

DRAWING FIGURES

Figure 1:
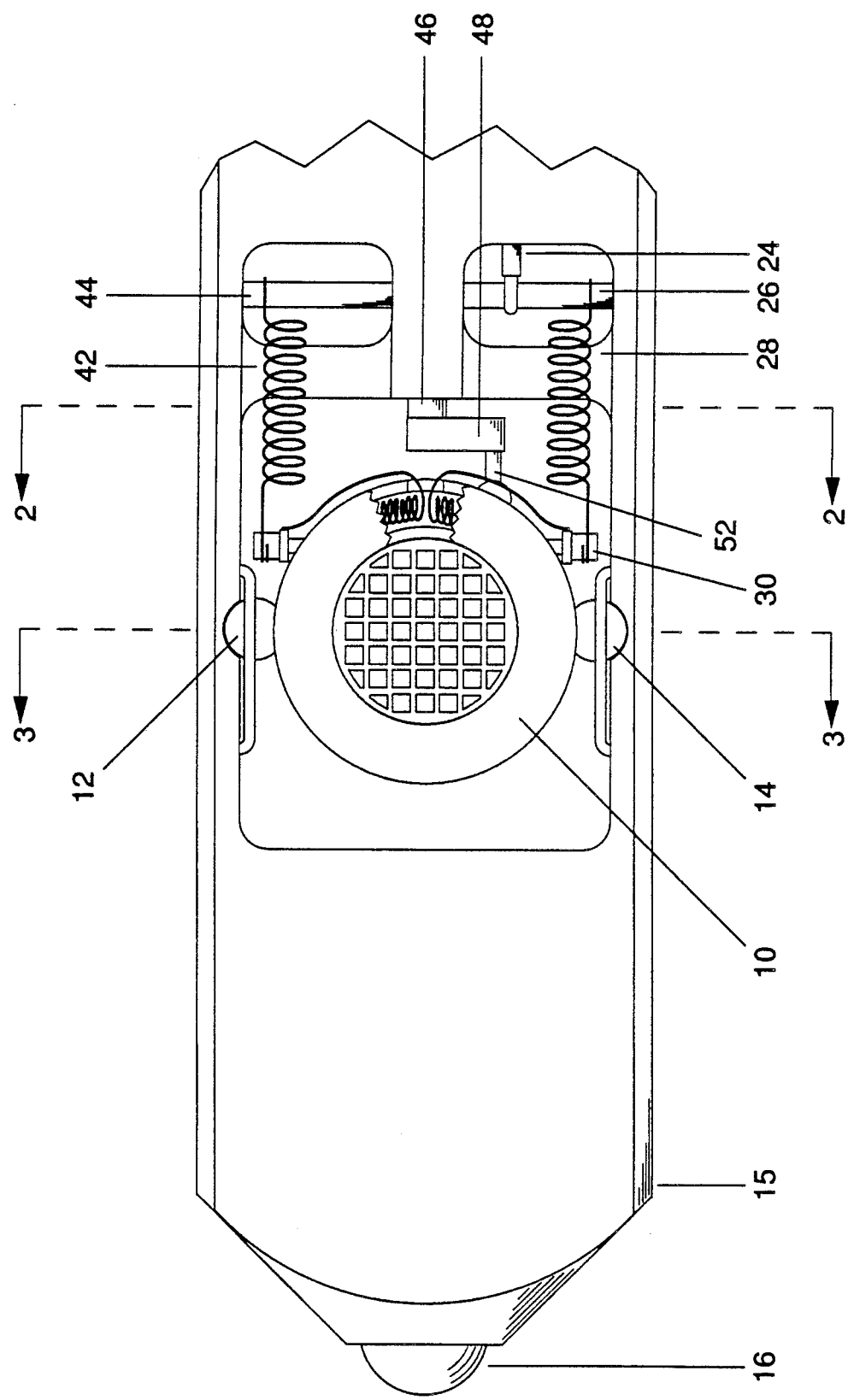
FIG. 1 shows the tip of the invention, viewed from below. A cut-away reveals part of the heater.

DRAWING REFERENCE NUMERALS 10 specimen cradle
14 second spherical ceramic bearing
16 ceramic tip bearing
20 elecrically insulating potting compound
24 supply lead
28 supply spring
32 first insulating ceramic post
36 heater ground lead
40 second insulating ceramic post
44 ground pin
48 crank
52 connecting pin
56 threaded ring
60 first ceramic pad
64 first vertical tip groove
68 first locating wire
12 first spherical ceramic bearing
15 tip
18 heater
22 circular groove
26 electrically isolated supply pin
30 supply bushing
34 heater supply lead
38 ground bushing
42 ground spring
46 rod
50 ceramic ball
54 horizontal cradle groove
58 specimen
62 second ceramic pad
66 second vertical tip groove
70 second locating wire

DESCRIPTION

Figure 2:
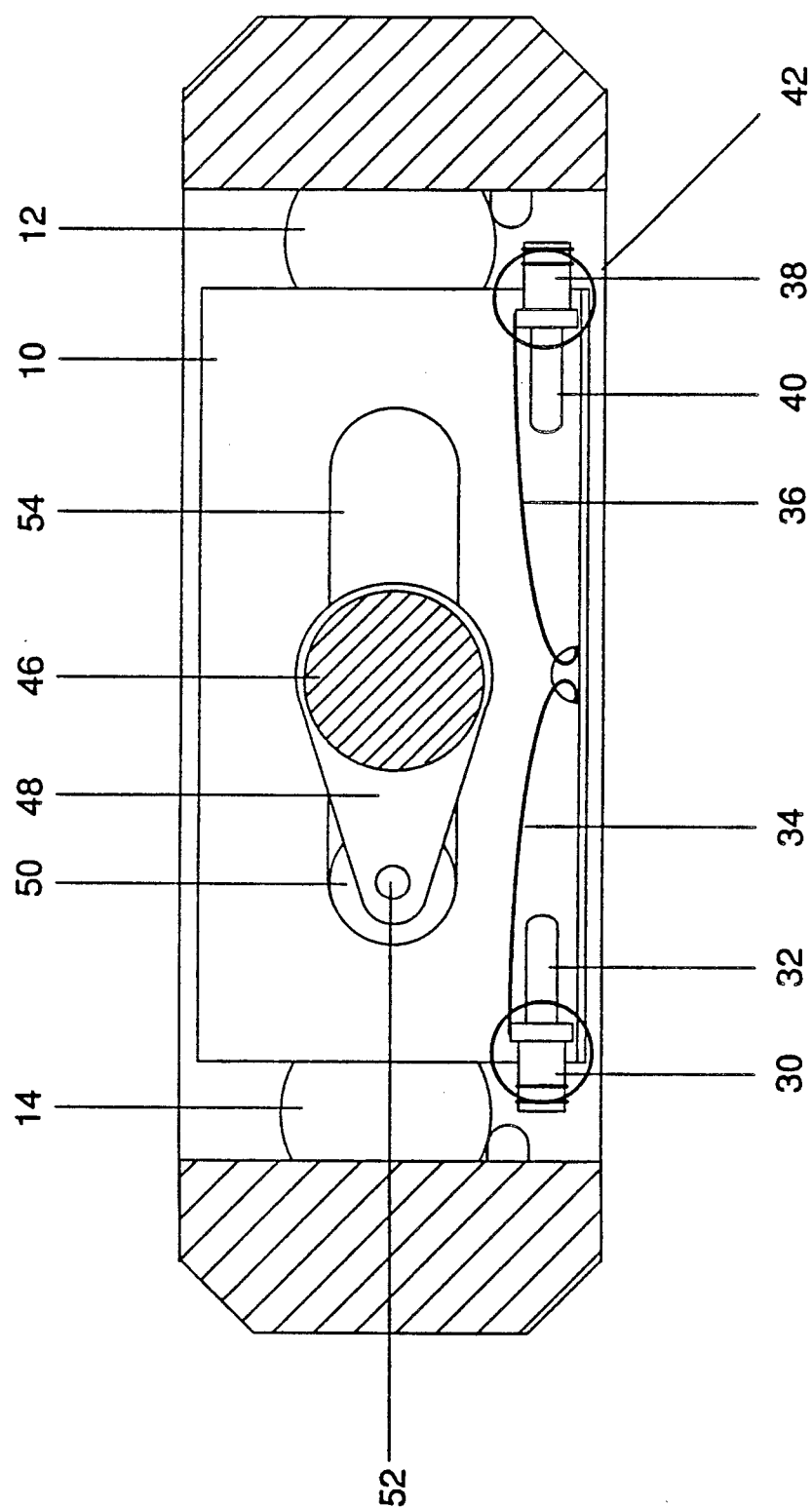
FIG. 2 shows a vertical section through the tip of the invention.
Figure 3:
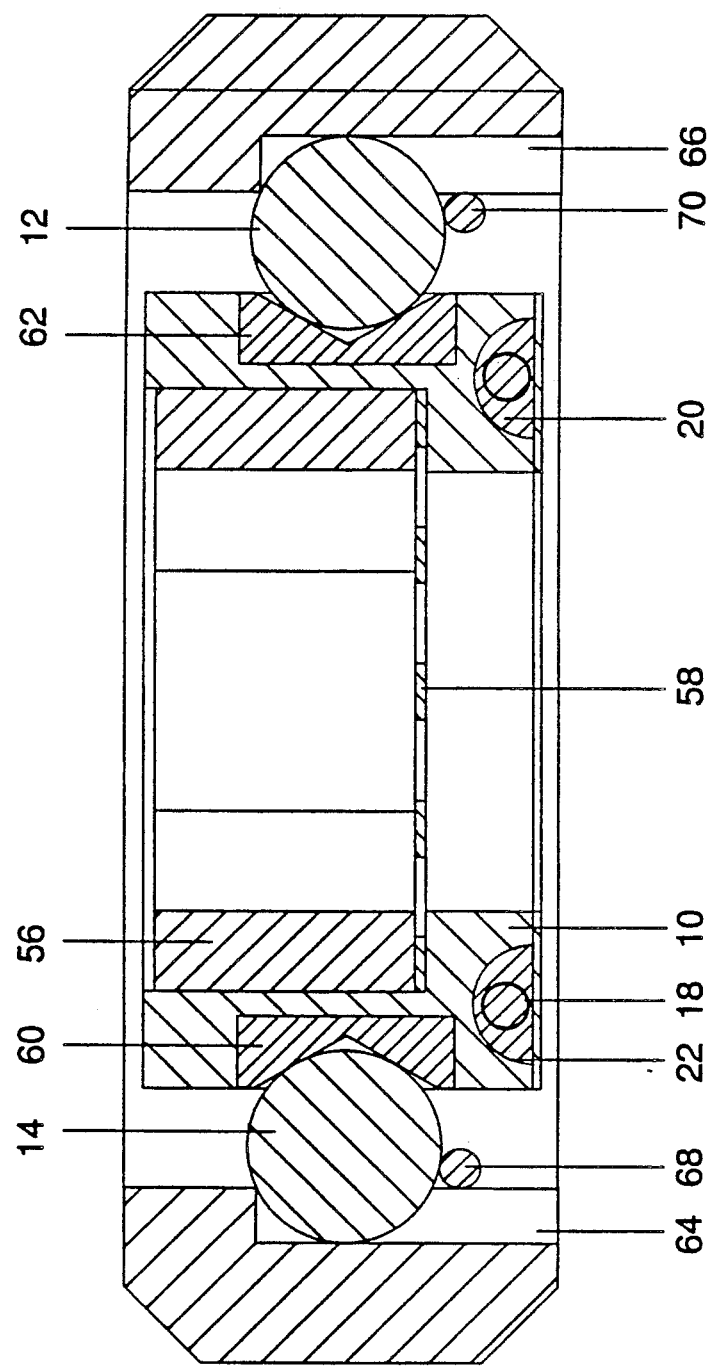
FIG. 3 shows a vertical section through the tip of the invention, revealing the construction of the cradle bearings.

With reference to FIG. 1, specimen cradle 10 is held by first and second spherical ceramic bearings 12 and 14 within an opening in tip 15 of the invention. Ceramic tip bearing 16, constructed according to U.S. Pat. No. 4,703,181 herein incorporated by way of reference, forms a low thermal conductivity bearing against the stage of the electron microscope. With reference to FIG. 3, heater 18 comprises a coiled element embedded in electrically insulating potting compound 20 within circular grove 22 in the underside of speciment cradle 10. With reference to FIG. 1, electrical power is provided from supply lead 24, connected to electrically isolated supply pin 26. Supply spring 28 hooks over electrically isolated supply pin 26 and supply bushing 30. Both connections are free to slide as specimen cradle 10 pivots about spherical ceramic bearings 12 and 14. With reference to FIG. 2, supply bushing 30 press-fits onto first insulating ceramic post 32 which in turn press fits into a a recess in the side of specimen cradle 10. Heater supply lead 34 connects to supply bushing 30. The return heater circuit is completed in a similar fashion: heater ground lead 36 connects to ground bushing 38, mounted on second insulating ceramic post 40 and ground spring 42 hooks over ground bushing 38 and ground pin 44. Unlike electrically isolated supply pin 26, ground pin 44 is in electrical contact with tip 15 which is in turn grounded via the TEM stage, thereby completing the heater supply circuit. The springs 28 and 42 are so constructed that they remain in tension for all possible positions of specimen cradle 10, thereby ensuring good electrical contact. As specimen cradle 10 is tilted, the ends of the springs slide around the pins and the bushings thereby avoiding any flexing of the springs. In this way, the springs survive many cycles of heating, specimen tilting and cooling.

With reference to FIG. 1, specimen cradle 10 is free to pivot on first and second spherical ceramic bearings 12 and 14. Rod 46 may be rotated about its long axis. With reference to FIG. 2, ceramic ball 50 freely rotates on connecting pin 52 and engages horizontal cradle groove 54 in the side of specimen cradle 10. As rod 46 is rotated about its axis, it moves crank 48, causing ceramic ball 50 to describe an arc of a diameter determined by the size of crank 48, and pivot specimen cradle 10 on spherical ceramic bearings 12 and 14.

With reference to FIG. 3, threaded ring 56 screws into specimen cradle 10 to retain specimen 58. First and second spherical ceramic bearings 12 and 14 engage conical concavities in first and second ceramic pads 60 and 62, which press fit into recesses in the side of specimen cradle 10. First and second spherical ceramic bearings 12 and 14 further engage in first and second vertical tip grooves 64 and 66, the grooves having a semicircular section of a radius just greater than that of first and second spherical ceramic bearings 12 and 14. Precise dimensioning of specimen cradle 10, first and second spherical ceramic bearings 12 and 14, first and second ceramic pads 60 and 62, and first and second vertical tip grooves 64 and 66 ensures that specimen cradle 10 can pivot freely. More importantly, the forces between these components is minimal thereby reducing conduction of heat away from specimen cradle 10. First and second locating wires 68 and 70 hold first and second spherical ceramic bearings 12 and 14 in position and are positioned to avoid applying excessive force.

When threaded ring 56 is inserted into or removed from specimen cradle 10 for specimen loading and unloading, the torque applied tends to twist specimen cradle 10. However, the cone-and-groove design of the specimen cradle bearing assemblies is very strong since as the applied torque increases, the true contact area (as opposed to the apparent area) increases rapidly, so spreading the load per unit area. As soon as the torque is removed, the bearing assemblies relax and return to a low thermal conductivity state.

While the above description contains many specificities, the reader should not construe these as limitations on the scope of the invention but merely as exemplifications of the preferred embodiments thereof. Those skilled in the art will envisage other possible variations within its scope. For example, the invention is not limited to transmission electron microscopes but can be applied to other types of microscope including e.g. scanning electron microscopes (SEM) and scanning tunneling microscopes (STM). Further, thermocouple leads for monitoring the the specimen cradle temperature are easily added in a manner similar to that disclosed for the heater supply leads.

What is claimed is:

1. An electron microscope specimen heating holder including:
   (a) a specimen cradle within an orifice in the tip of the holder,
   (b) bearing means retaining said specimen cradle within said orifice,
   (c) tilting means whereby said specimen cradle may be tilted about an axis perpendicular to the long axis of the holder,
   (d) a heater in good thermal contact with said specimen cradle, said heater being electrically connected to a first electrically isolated bushing and to a second electrically isolated bushing, the bushings being mounted on said specimen cradle,
   (e) means to supply electrical current to a pair of electrically isolated pins mounted in the tip of the holder adjacent to said specimen cradle,
   (f) a first spring having a first end hooked over one of the electrically isolated pins and a second end hooked over said first electrically isolated bushing, the length of said first spring being such that it is always in tension, and
   (h) a second spring having a first end hooked over the second of the electrically isolated pins and a second end hooked over said second electrically isolated bushing, the length of said second spring being such that it is always in tension,
whereby when said specimen cradle is tilted by said tilting means the connections between the springs and the bushings, and the between the springs and the pins slide freely while maintaining good electrical contact thereby avoiding bending of the springs.

2. The invention as claimed in claim 1 wherein said bearing means comprise:
   (a) first and second conical concavities in the outer wall of said specimen cradle, the first concavity being diametrically opposed to the second concavity,
   (b) first and second low thermal conductivity spheres,
   (c) first and second grooves in the inner wall of said orifice, each of said grooves being oriented perpendicularly to the long axis of the holder and each being of a length less than the depth of the orifice and each being placed so as to have an open end and a closed end, (d) said specimen cradle being positioned within said orifice and retained therein by the first sphere engaging the first groove and the first concavity, and the second sphere engaging the second groove and the second concavity, (e) the spheres, concavities and grooves being dimensioned so that said specimen cradle may freely pivot about a diametrical axis joining the apices of the concavities, and (f) first and second retaining wires, said wires being placed across the grooves to hold the spheres within the grooves, whereby the bearings are of low thermal conductivity and high strength.

3. A microscope specimen heating holder including:

(a) a specimen cradle within an orifice in the tip of the holder, (b) a heater in close thermal contact with said specimen cradle, (c) heater supply means whereby electrical power is provided to said heater, (d) first and second conical concavities in the outer wall of said specimen cradle, the first concavity being diametrically opposed to the second concavity, (e) first and second low thermal conductivity spheres, (f) first and second grooves in the inner wall of said orifice, each of said grooves being oriented perpendicularly to the long axis of the holder and each being of a length less than the depth of the orifice and each being placed so as to have an open end and a closed end, (g) first and second retaining wires, said wires being placed across the open ends of the grooves to hold the spheres within the grooves, and (h) tilting means, (i) said specimen cradle being retained within said orifice by the first sphere engaging the first groove and the first concavity, and the second sphere engaging the second groove and the second concavity, (j) the spheres, concavities and grooves being dimensioned so that said specimen cradle may be tilted by said tilting means about a diametrical axis joining the apices of the concavitites, whereby bearings of low thermal conductivity and high strength are provided for said specimen cradle.

4. The invention as claimed in claim 3 wherein said heater supply means comprise:

(a) a supply lead of said heater being electrically connected to a first electrically isolated bushing and a ground lead of said heater being electrically connected to a second electrically isolated bushing, the bushings being mounted on said specimen cradle, (b) electrical means to supply electrical current to an electrically isolated pin mounted in the tip of the holder adjacent to said specimen cradle, (c) a ground pin mounted in the tip of the holder adjacent to said specimen cradle and in electrical contact with the holder, (d) a first spring having a first end hooked over said electrically isolated pin and a second end hooked over said first electrically isolated bushing, said first spring being dimensioned such that it always remains in tension, and (e) a second spring having a first end hooked over said ground pin and a second end hooked over said second electrically isolated bushing, said second spring being dimensioned such that it always remains in tension, whereby when said specimen cradle is tilted by said tilting means the connections between the springs and bushings, and between the springs and the pins slide freely while maintaining good electrical contact thereby avoiding flexing of the springs.

* * * * *